(12) United States Patent
Goto et al.

(10) Patent No.: US 7,615,400 B2
(45) Date of Patent: Nov. 10, 2009

(54) METHOD FOR PRODUCING MULTIJUNCTION SOLAR CELL

(75) Inventors: Hajime Goto, Wako (JP); Junichi Motohisa, Sapporo (JP); Takashi Fukui, Sapporo (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 12/285,158

(22) Filed: Sep. 30, 2008

(65) Prior Publication Data

US 2009/0087941 A1 Apr. 2, 2009

(30) Foreign Application Priority Data

Oct. 1, 2007 (JP) .............................. 2007-257731
Sep. 3, 2008 (JP) .............................. 2008-225684

(51) Int. Cl.
 *H01L 21/00* (2006.01)
(52) U.S. Cl. .............................. 438/94; 438/62; 438/69; 438/72; 438/74; 438/95; 257/E21.102
(58) Field of Classification Search .................. 438/62, 438/74, 94
See application file for complete search history.

(56) References Cited

U.S. PATENT DOCUMENTS

2006/0207647 A1* 9/2006 Tsakalakos et al. ......... 136/256

FOREIGN PATENT DOCUMENTS

JP 09-064386 A 3/1997

OTHER PUBLICATIONS

J.F. Geisz, D.J. Friedman, C. Kramer, A. Kibbler, and S.R. Kurtz, "New Materials for Future Generations of III-V Solar Cells", NREL/CP-520-25631, National Renewable Energy Laboratory, Dec. 1998.
Akira Ohmae, Yukiko Shimizu, and Yoshitaka Okada, "GaInNAs for Multi-Junction Tandem Solar Cells", Photovoltaic Energy Conversion, 2003, Proceedings of 3rd World conference on vol. 2, May 12-16, 2003.

* cited by examiner

*Primary Examiner*—N Drew Richards
*Assistant Examiner*—Kyoung Lee
(74) *Attorney, Agent, or Firm*—Birch, Stewart, Kolasch & Birch, LLP

(57) ABSTRACT

There is provided a method for producing a multijunction solar cell having four-junctions, the method allowing the area of a device to be increased. On a nucleation site formed on a substrate 2, is grown a semiconductor 2a comprising the same material as the substrate 2 in the shape of a wire. On the semiconductor 2a, are successively grown semiconductors 3, 4, 5, and 6 with a narrower band gap in the shape of a wire. The semiconductor 3 may be directly grown in the shape of a wire on the nucleation site formed on the substrate 2. It is preferred to form the nucleation site by forming an amorphous $SiO_2$ coating 8a on the substrate 2 and etching a part of the amorphous $SiO_2$ coating 8a. Further, it is preferred to form an insulating film 8 in the region except the nucleation sites on the substrate 2 by allowing the amorphous $SiO_2$ coating 8a to remain therein. The semiconductor 2a is GaP; the semiconductor 3 is $Al_{0.3}Ga_{0.7}As$; the semiconductor 4 is GaAs; the semiconductor 5 is $In_{0.3}Ga_{0.7}As$; and the semiconductor 6 is $In_{0.6}Ga_{0.4}As$.

12 Claims, 3 Drawing Sheets

METHOD FOR PRODUCING MULTIJUNCTION SOLAR CELL

BACKGROUND OF THE INVENTION

1. Field of the Invention

The present invention relates to a method for producing a multijunction solar cell.

2. Description of the Related Art

Conventionally, a single-junction solar cell comprising a single pn junction has been known. However, it is known that the power generation efficiency of the single-junction solar cell is only about 30% under terrestrial sunlight irradiation conditions irrespective of kind of semiconductor materials used, because the power generation efficiency has a theoretical limit determined by the band gap Eg of a semiconductor material used as a raw material.

Thus, in order to obtain power generation efficiency higher than that of the single-junction solar cell, there is proposed a multijunction solar cell formed by laminating a plurality of solar cells in which each cell has a pn junction. As the simplest of the multijunction solar cells, there is known a two-junction solar cell 11 as shown in FIG. 5 (refer to Japanese Patent Laid-Open No. 9-64386).

The two-junction solar cell 11 comprises a back electrode 12, a bottom cell 13 laminated by epitaxial growth thereon, a top cell 14 laminated by epitaxial growth on the bottom cell 13, and a surface electrode 15 laminated on the top cell 14. In the two-junction solar cell 11, the bottom cell 13 comprises a pn junction of GaAs, and the top cell 14 comprises a pn junction of InGaP.

The basic principle of the multijunction solar cell is to expand the available region of the sunlight spectrum by joining semiconductors having different band gaps, and it is known that efficiency will increase when the number of junctions is increased. For example, a four-junction solar cell has been simulated, and a highly efficient solar cell is expected.

However, a combination of semiconductors having different band gaps generally results in a combination of semiconductors having lattice constants which are different to each other. Therefore, when semiconductors having largely different lattice constants to each other are intended to be joined, a defect will occur at the interface. This poses a problem that the efficiency cannot be improved. This problem is due to the fact that since a large number of dangling bonds present in the defect cause the recombination of excitons excited by sunlight, it is impossible to take out them as electric power.

As a result, the semiconductors which constitute the multijunction solar cell are limited to a combination of materials having lattice constants similar to each other (a combination in which so called lattice matching is achieved) while these materials have band gaps different to each other. When matching with the sunlight spectrum is added to the above combination, the semiconductors will be limited to a combination for constituting a three-junction solar cell such as a combination of InGaP, GaAs, and Ge, or a combination of InGaP, InGaAs, and Ge.

GaInNAs is the only material that attracts attention as a material having a band gap of about 1 eV while maintaining lattice matching with Ge and GaAs. Research of a four-junction solar cell by combining InGaP, InGaAs, GaInNAs, and Ge has been continued (Refer to J. F. Geisz, D. J. Friedman, C. Kramer, A. Kibbler, and S. R. Kurtz, "New Materials for Future Generations of III-V Solar Cells", NREL/CP-520-25631, National Renewable Energy Laboratory, December 1998).

However, GaInNAs has the disadvantage of difficulty in crystal growth for achieving a four-junction solar cell due to the occurrence of phase separation and defects.

Moreover, the performance of a three-junction solar cell has been evaluated by a device of 4 $cm^2$ or less, and it is known that the efficiency is reduced as the area of the device increases (Refer to Akira Ohmae, Yukiko Shimizu, and Yoshitaka Okada, "GaInNAs for Multi-Junction Tandem Solar Cells", Photovoltaic Energy Conversion, 2003, Proceedings of 3rd World conference on Volume 2, 12-16 May 2003). The reduction of the efficiency is assumed to be due to the occurrence of defects near the junction interface even in a two-junction solar cell or a three-junction solar cell because the semiconductors have lattice constants different to each other.

Therefore, the multijunction solar cell has the disadvantage of difficulty in increasing the area of the device.

SUMMARY OF THE INVENTION

An object of the present invention is to provide a method for producing a multijunction solar cell which can eliminate such a disadvantage to achieve a multijunction solar cell having four junctions and increase the area of a device.

In order to achieve the object, a first aspect of the method for producing the multijunction solar cell of the present invention comprises the steps of: forming a nucleation site on a substrate; supplying a first raw material gas and growing a first semiconductor in the shape of a wire on the nucleation site, the first semiconductor being comprising the same material as the substrate; and supplying a second raw material gas and growing a first single-junction solar cell in the shape of a wire on the first semiconductor, the single-junction solar cell comprising a second semiconductor having a narrower band gap than the first semiconductor.

In the first aspect of the production method of the present invention, the nucleation site is first formed on the substrate, and then the first raw material gas is supplied. The substrate may or may not be a semiconductor. In this way, the first semiconductor grows in the shape of a wire by using the nucleation site as a nucleus. Next, supply of the second raw material gas causes the second semiconductor to grow in the shape of a wire on the tip part of the wire-shaped first semiconductor to form the first single-junction solar cell comprising the second semiconductor.

Supply of each of the raw material gases and growth of each of the semiconductors can be performed, for example, by using a metal-organic vapor-phase epitaxy apparatus (hereinafter, may be abbreviated as an MOVPE apparatus). At this time, in order to grow a semiconductor having a wider band gap on a semiconductor having a narrower band gap, it is necessary to first grow the semiconductor having a narrower band gap in the shape of a wire and then grow the semiconductor having a wider band gap at a temperature higher than the growing temperature of the semiconductor having a narrower band gap. However, if such a procedure is employed, the semiconductor having a narrower band gap already grown in the shape of a wire will be deteriorated to reduce the crystal quality while the semiconductor having a wider band gap is growing in the shape of a wire.

Therefore, in the first aspect of the production method of the present invention, the second semiconductor having a narrower band gap than the first semiconductor is grown on the first semiconductor. In this way, the second semiconductor can be grown in the shape of a wire without reducing the crystal quality of the first semiconductor that is already grown in the shape of a wire.

As a result, according to the production method of the present invention, the second wire-shaped semiconductor can be grown epitaxially on the first wire-shaped semiconductor, thereby capable of forming the first single-junction solar cell comprising the second semiconductor. Moreover, at this time, it is possible to provide excellent performance to the first single-junction solar cell by preventing the occurrence of dislocation in the second semiconductor by interposing the first semiconductor comprising the same material as the substrate between the substrate and the first single-junction solar cell.

The first aspect of the production method of the present invention preferably further comprises the steps of: supplying a third raw material gas and growing a second single-junction solar cell in the shape of a wire on the first single-junction solar cell, the second single-junction solar cell comprising a third semiconductor having a narrower band gap than the second semiconductor; supplying a fourth raw material gas and growing a third single-junction solar cell in the shape of a wire on the second single-junction solar cell, the third single-junction solar cell comprising a fourth semiconductor having a narrower band gap than the third semiconductor; and supplying a fifth raw material gas and growing a fourth single-junction solar cell in the shape of a wire on the third single-junction solar cell, the fourth single-junction solar cell comprising a fifth semiconductor having a narrower band gap than the fourth semiconductor.

In this way, the second single-junction solar cell comprising the third semiconductor can be grown in the shape of a wire on the first single-junction solar cell in the same manner as in the step of supplying the second raw material gas and growing the first single-junction solar cell comprising the second semiconductor in the shape of a wire. In the same manner, the third single-junction solar cell comprising the fourth semiconductor can be grown in the shape of a wire on the second single-junction solar cell, and the fourth single-junction solar cell comprising the fifth semiconductor can be grown in the shape of a wire on the third single-junction solar cell.

As a result, the second semiconductor through the fifth semiconductor each in the shape of a wire can be grown epitaxially on the first wire-shaped semiconductor, and the multijunction solar cell with four junctions can be formed in which the first single-junction solar cell through the fourth single-junction solar cell are successively joined.

In the first aspect of the production method of the present invention, for example, the first semiconductor is GaP; the second semiconductor is $Al_{0.3}Ga_{0.7}As$; the third semiconductor is GaAs; the fourth semiconductor is $In_{0.3}Ga_{0.7}As$; and the fifth semiconductor is $In_{0.6}Ga_{0.4}As$.

Further, in the production method of the present invention, the first single-junction solar cell comprising the first semiconductor may be directly formed on the substrate, as a second aspect. Thus, the second aspect of the production method of the present invention comprises the steps of: forming a nucleation site on a substrate; supplying a first raw material gas and growing a first single-junction solar cell comprising a first semiconductor in the shape of a wire on the nucleation site; and supplying a second raw material gas and growing a second single-junction solar cell in the shape of a wire on the first single-junction solar cell, the second single-junction solar cell comprising a second semiconductor having a narrower band gap than the first semiconductor.

In the second aspect of the production method of the present invention, the nucleation site is first formed on the substrate, and then the first raw material gas is supplied. The substrate may or may not be a semiconductor. In this way, the first semiconductor grows in the shape of a wire by using the nucleation site as a nucleus to form the first single-junction solar cell comprising the first semiconductor. Next, supply of the second raw material gas causes the second semiconductor to grow in the shape of a wire on the tip part of the wire-shaped first semiconductor to form the first single-junction solar cell comprising the second semiconductor on the first single-junction solar cell.

In the second aspect of the production method of the present invention, the second semiconductor having a narrower band gap than the first semiconductor is grown on the first semiconductor. Therefore, the second semiconductor can be grown in the shape of a wire without reducing the crystal quality of the first semiconductor that is already grown in the shape of a wire. As a result, the second wire-shaped semiconductor can be grown epitaxially on the first wire-shaped semiconductor, thereby capable of forming the multijunction solar cell comprising the first single-junction solar cell comprising the first semiconductor and the second single-junction solar cell comprising the second semiconductor.

The second aspect of the production method of the present invention preferably further comprises the steps of: supplying a third raw material gas and growing a third single-junction solar cell in the shape of a wire on the second single-junction solar cell, the third single-junction solar cell comprising a third semiconductor having a narrower band gap than the second semiconductor; and supplying a fourth raw material gas and growing a fourth single-junction solar cell in the shape of a wire on the third single-junction solar cell, the fourth single-junction solar cell comprising a fourth semiconductor having a narrower band gap than the third semiconductor.

In this way, the third single-junction solar cell comprising the third semiconductor can be grown in the shape of a wire on the second single-junction solar cell in the same manner as in the step of supplying each of the raw material gases and growing the single-junction solar cells each comprising each of the semiconductors in the shape of a wire. In the same manner, the fourth single-junction solar cell comprising the fourth semiconductor can be grown in the shape of a wire on the third single-junction solar cell.

As a result, the second semiconductor through the fourth semiconductor each in the shape of a wire can be grown epitaxially on the first wire-shaped semiconductor, and the multijunction solar cell with four junctions can be formed in which the first single-junction solar cell through the fourth single-junction solar cell are successively joined.

In the second aspect of the production method of the present invention, for example, the first semiconductor is $Al_{0.3}Ga_{0.7}As$; the second semiconductor is GaAs; the third semiconductor is $In_{0.3}Ga_{0.7}As$; and the fourth semiconductor is $In_{0.6}Ga_{0.4}As$.

When forming a multijunction solar cell with four junctions in the manner as described in the aspects of the production method of the present invention, a multijunction structure in which each junction involves different semiconductors will be formed by wire-shaped semiconductors. As a result, a junction interface of the wire-shaped semiconductors has a very small area, which relieves the distortion resulting from the difference of the lattice constants and can prevent the occurrence of defects. Therefore, the limit of selecting materials resulting from the difference of the lattice constants can be mitigated to increase the alternatives for combining materials.

Further, according to the aspects of the production method of the present invention, since wire-shaped semiconductors are grown epitaxially on a substrate, the resulting multijunction solar cell is in the shape of a wire in itself. Therefore, the junction interfaces are very small and no defect will occur, and so a large-area device comprising an aggregate of the wire-shaped multifunction solar cells can be obtained by forming an unlimited number of the wire-shaped multifunction solar cells on the substrate.

Note that, in the aggregate of the wire-shaped multifunction solar cells, the multifunction solar cells need to be insulated to each other. Thus, in the aspects of the production method of the present invention, it is preferred to form a coating comprising an insulating material such as an amorphous $SiO_2$ on the substrate and form the nucleation sites by etching a part of the coating. Further, it is preferred to form an insulating film in the region except the nucleation sites on the substrate by allowing the coating to remain therein. This allows both the nucleation sites and the insulating film to be formed. Further, the insulating film can be formed in the region on the substrate except the first semiconductor layers formed thereon to insulate the first semiconductor layers to each other.

DETAILED DESCRIPTION OF THE PREFERRED EMBODIMENTS

Next, the embodiments of the present invention will be described in more detail with reference to the attached drawings.

Figure 1:
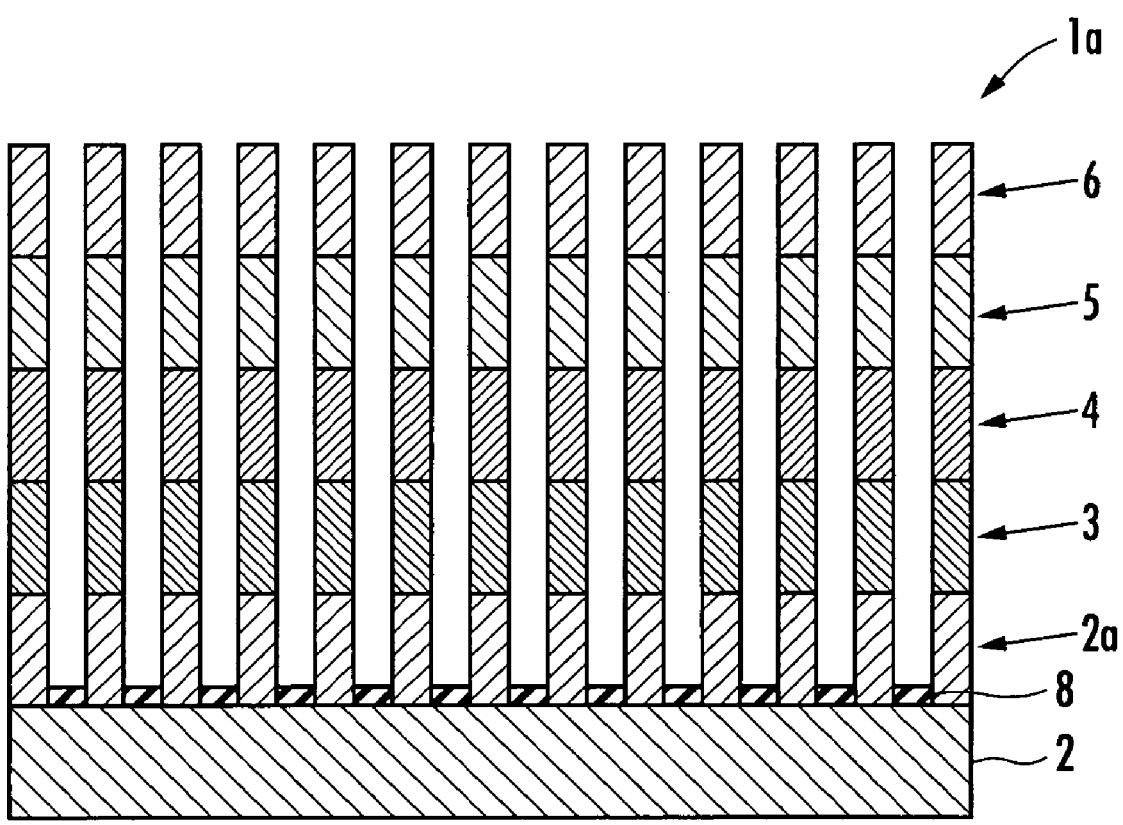
FIG. 1 is an explanatory sectional view showing the constitution of an embodiment of the multifunction solar cell obtained by the production method of the present invention.

As shown in FIG. 1, a multifunction solar cell 1a obtained by the production method of the present embodiment comprises a substrate 2, a first semiconductor 2a grown in the shape of a wire on the substrate 2, a second semiconductor 3 which is connected to an end located farther from the substrate 2 of the first semiconductor 2a and is grown in the shape of a wire, a third semiconductor 4 which is connected to an end located farther from the substrate 2 of the second semiconductor 3 and is grown in the shape of a wire, a fourth semiconductor 5 which is connected to an end located farther from the substrate 2 of the third semiconductor 4 and is grown in the shape of a wire, and a fifth semiconductor 6 which is connected to an end located farther from the substrate 2 of the fourth semiconductor 5 and is grown in the shape of a wire. In the multijunction solar cell 1a, the semiconductor 3 forms a first single-junction solar cell; the semiconductor 4 forms a second single-junction solar cell; the semiconductor 5 forms a third single-junction solar cell; and the semiconductor 6 forms a fourth single-junction solar cell. Thus, the multifunction solar cell 1a forms a four-junction solar cell. An insulating film 8 comprising amorphous $SiO_2$ is formed in the region except the semiconductors 2a on the substrate 2, and the semiconductors 2a are insulated from each other by the insulating film 8. The semiconductor 2a comprises the same material as the substrate 2 to prevent the occurrence of dislocation in the semiconductor 3 and does not form a solar cell.

In the multijunction solar cell 1a, for example, a semiconductor comprising GaP111B can be used as the substrate 2. Further, a semiconductor comprising GaP can be used as the first semiconductor 2a; a semiconductor comprising $Al_{0.3}Ga_{0.7}As$ can be used as the second semiconductor 3; a semiconductor comprising GaAs can be used as the third semiconductor 4; a semiconductor comprising $In_{0.3}Ga_{0.7}As$ can be used as the fourth semiconductor 5; and a semiconductor comprising $In_{0.6}Ga_{0.4}As$ can be used as the fifth semiconductor 6. The semiconductors 2a, 3, 4, 5, and 6 each have a length of, for example, 1 μm.

The multifunction solar cell 1a shown in FIG. 1 can be produced, for example, according to the following procedures.

When producing the multifunction solar cell 1a, a nucleation sites are formed on the substrate 2 comprising GaP111B, as the first step.

For forming the nucleation sites, the substrate 2 comprising GaP111B is first cleaned, and an amorphous $SiO_2$ coating 8a with a thickness of about 30 nm is formed on the surface of the substrate 2. The amorphous $SiO_2$ coating 8a can be formed, for example, using a high-frequency sputtering (RF sputtering) device comprising an amorphous $SiO_2$ target.

Figure 2:
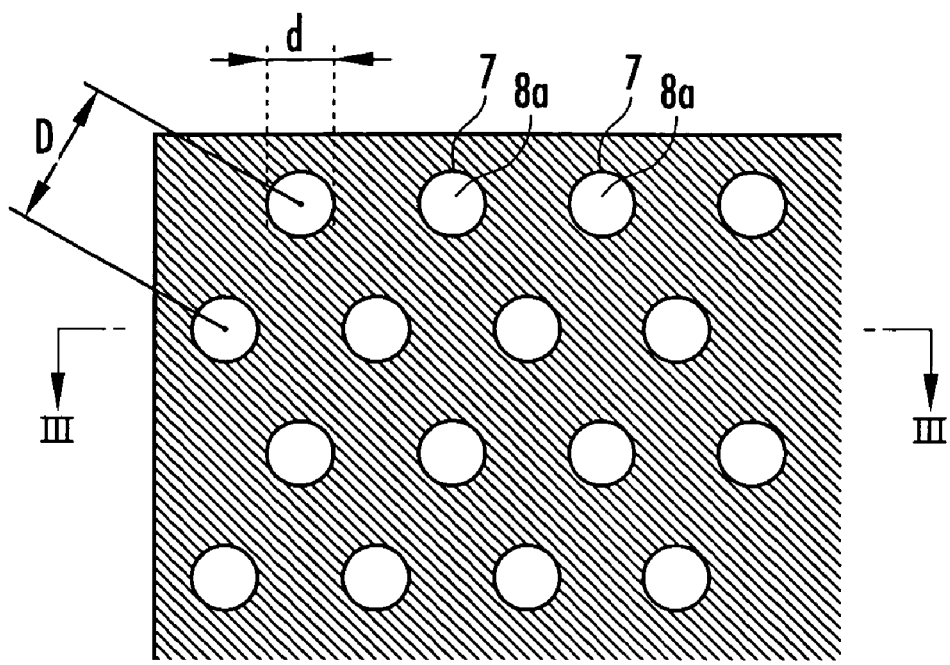
FIG. 2 is a plan view showing a method for forming a nucleation site on a substrate.

Next, a positive resist is applied on the amorphous $SiO_2$ coating 8a formed on the substrate 2, which is then set in an EB drawing device and a pattern is drawn thereon. In the pattern, the centers of a plurality of circles 7 are each located at the apex of an equilateral triangle, for example, as shown in FIG. 2. The diameter d of the circle 7 is, for example, 50 nm, and the center distance D of each circle 7 is, for example, 400 nm.

Figure 3:
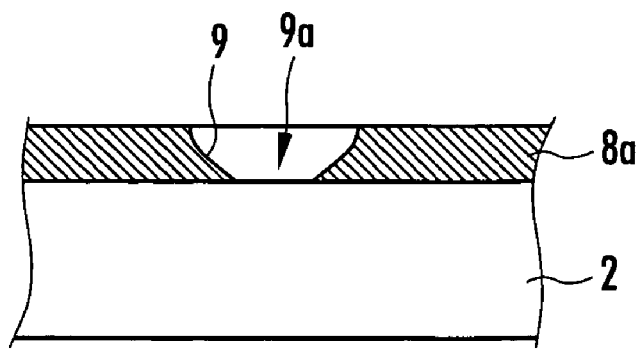
FIG. 3 is a sectional view along the line III-III of FIG. 2.

Next, the resist in each circle 7 is removed and the amorphous $SiO_2$ coating 8a is exposed by developing the resist on which a plurality of circles 7 are drawn as shown in FIG. 2. The substrate 2 is then immersed in a buffer solution (BHF solution) of fluoric acid and ammonium fluoride which is diluted by 50 times to remove the amorphous $SiO_2$ coating 8a by etching followed by removing the resist followed by cleaning. As a result, as shown in FIG. 3, mortar-shaped holes 9 are formed in the amorphous $SiO_2$ coating 8a formed on the substrate 2. After the etching, the hole 9 has a diameter at the surface of the amorphous $SiO_2$ coating 8a of 50 nm and a diameter of an opening 9a at the bottom of the hole of 20 nm. The substrate 2 exposed from the opening 9a serves as the nucleation site.

Next, in the second step of producing the multijunction solar cell 1a, the first semiconductors 2a comprising GaP are grown on the substrate 2 on which the nucleation sites are formed.

For growing the first semiconductors 2a, the substrate 2 on which the nucleation sites are formed is first mounted in a reaction chamber of a metal-organic vapor-phase epitaxy apparatus (MOVPE apparatus). The MOVPE apparatus is evacuated and then replaced with $H_2$ gas. The evacuation speed and the gas flow rate are adjusted so that the total pressure may be stabilized at 0.1 atm.

Next, the reaction chamber is raised to a temperature where the substrate 2 reaches 900° C. while circulating a mixed gas of tributyl phosphate (hereinafter abbreviated as TBP) and $H_2$ gas as a carrier gas (total pressure: 0.1 atm, partial pressure of TBP: $1.1 \times 10^{-4}$ atm) in the reaction chamber. When the temperature of the substrate 2 has reached 900° C., the gas circulating in the reaction chamber is changed to a mixed gas of trimethylgallium (hereinafter abbreviated as TMG), TBP, and $H_2$ gas as a carrier gas (total pressure: 0.1 atm, partial pressure of TMG: $4\times10^{-6}$ atm, partial pressure of TBP: $6\times10^{-5}$ atm) to grow the first semiconductors 2a comprising GaP in the shape of a wire on the substrate 2. Then, after three minutes, the gas circulating in the reaction chamber is changed again to a mixed gas of TBP and $H_2$ gas as a carrier gas (total pressure: 0.1 atm, partial pressure of TBP: $1.1\times10^{-4}$ atm) to finish the growth of the first semiconductors 2a. At this time, an insulating film 8 comprising the amorphous $SiO_2$ coating 8a is formed by allowing the amorphous $SiO_2$ coating 8a to remain in the region except the first semiconductors 2a grown on the substrate 2.

Next, in the third step of producing the multifunction solar cell 1a, second semiconductors 3 comprising $Al_{0.3}Ga_{0.7}As$ are each grown on an end located farther from the substrate 2 of the first semiconductor 2a.

For growing the second semiconductors 3, the temperature of the substrate 2 is reduced from 900° C. to 850° C. while circulating the mixed gas of TBP and $H_2$ gas as a carrier gas in the reaction chamber. When the temperature of the substrate 2 has reached 850° C., the gas circulating in the reaction chamber is changed to a mixed gas of trimethylaluminum (hereinafter abbreviated as TMA), TMG, $AsH_3$, and $H_2$ gas as a carrier gas (total pressure: 0.1 atm, partial pressure of TMA: $6\times10^{-7}$ atm, partial pressure of TMG $6\times10^{-6}$ atm, partial pressure of $AsH_3$: $5\times10^{-5}$ atm) to grow each of the second semiconductors 3 comprising $Al_{0.3}Ga_{0.7}As$ in the shape of a wire on an end located farther from the substrate 2 of the first semiconductor 2a. Then, after 15 minutes, the gas circulating in the reaction chamber is changed to a mixed gas of $ArH_3$ and $H_2$ gas as a carrier gas (total pressure: 0.1 atm, partial pressure of $ArH_3$: $6\times10^{-5}$ atm) to finish the growth of the second semiconductors 3.

Next, in the fourth step of producing the multifunction solar cell 1a, third semiconductors 4 comprising GaAs are each grown on an end located farther from the substrate 2 of the second semiconductor 3.

For growing the third semiconductors 4, the temperature of the substrate 2 is reduced from 850° C. to 750° C. while circulating the mixed gas of $ArH_3$ and $H_2$ gas as a carrier gas in the reaction chamber. When the temperature of substrate 2 has reached 750° C., the gas circulating in the reaction chamber is changed to a mixed gas of TMG, $AsH_3$ and $H_2$ gas as a carrier gas (total pressure: 0.1 atm, partial pressure of TMG: $1\times10^{-6}$ atm, partial pressure of $AsH_3$: $2.5\times10^{-4}$ atm) to grow each of the third semiconductors 4 comprising GaAs in the shape of a wire on an end located farther from the substrate 2 of the second semiconductor 3. Then, after 15 minutes, the gas circulating in the reaction chamber is changed again to the mixed gas of $ArH_3$ and $H_2$ gas as a carrier gas to finish the growth of the third semiconductors 4.

Next, in the fifth step of producing the multifunction solar cell 1a, fourth semiconductors 5 comprising $In_{0.3}Ga_{0.7}As$ are each grown on an end located farther from the substrate 2 of the third semiconductor 4.

For growing the fourth semiconductors 5, the temperature of the substrate 2 is reduced from 750° C. to 650° C. while circulating the mixed gas of $ArH_3$ and $H_2$ gas as a carrier gas in the reaction chamber. When the temperature of the substrate 2 has reached 650° C., the gas circulating in the reaction chamber is changed to a mixed gas of trimethylindium (hereinafter abbreviated as TMI), TMG, $AsH_3$, and $H_2$ gas as a carrier gas (total pressure: 0.1 atm, partial pressure of TMI: $2.25\times10^{-6}$ atm, partial pressure of TMG: $5.25\times10^{-6}$ atm, partial pressure of $AsH_3$: $6.25\times10^{-5}$ atm) to grow each of the fourth semiconductors 5 comprising $In_{0.3}Ga_{0.7}As$ in the shape of a wire on an end located farther from the substrate 2 of the third semiconductor 4. Then, after 15 minutes, the gas circulating in the reaction chamber is changed again to the mixed gas of $ArH_3$ and $H_2$ gas as a carrier gas to finish the growth of the fourth semiconductors 5.

Next, in the sixth step of producing the multifunction solar cell 1a, fifth semiconductors 6 comprising $In_{0.6}Ga_{0.4}As$ are each grown on an end located farther from the substrate 2 of the fourth semiconductor 5.

For growing the fifth semiconductors 6, the temperature of the substrate 2 is reduced from 650° C. to 600° C. while circulating the mixed gas of $ArH_3$ and $H_2$ gas as a carrier gas in the reaction chamber. When the temperature of the substrate 2 has reached 600° C., the gas circulating in the reaction chamber is changed to a mixed gas of TMI, TMG, $AsH_3$, and $H_2$ gas as a carrier gas (total pressure: 0.1 atm, partial pressure of TMI: $4.50\times10^{-6}$ atm, partial pressure of TMG: $3.00\times10^{-6}$ atm, partial pressure of $AsH_3$: $6.25\times10^{-5}$ atm) to grow each of the fifth semiconductor 6 comprising $In_{0.6}Ga_{0.4}As$ in the shape of a wire on an end located farther from the substrate 2 of the fourth semiconductor 5. Then, after 15 minutes, the gas circulating in the reaction chamber is changed again to the mixed gas of $ArH_3$ and $H_2$ gas as a carrier gas to finish the growth of the fifth semiconductors 6.

Next, the reaction chamber is cooled while circulating $H_2$ gas mixed with 20 vol % of $AsH_3$, and then the substrate 2 on which the semiconductors 2a, 3, 4, 5, and 6 are grown in the shape of a wire is taken out as the multifunction solar cell 1a.

In the multifunction solar cell 1a formed according to the above procedures, the insulating film 8 is formed in the region except the first semiconductors 2a on the substrate 2, and the first semiconductors 2a can be insulated to each other.

The band gap and lattice constant of each semiconductor forming the multifunction solar cell 1a are shown in Table 1.

TABLE 1

|  |  | Band gap (eV) | Lattice constant (A) |
|---|---|---|---|
| First semiconductor 2a | GaP | 2.3 | 5.451 |
| Second semiconductor 3 | $Al_{0.3}Ga_{0.7}As$ | 1.8 | 5.655 |
| Third semiconductor 4 | GaAs | 1.4 | 5.653 |
| Fourth semiconductor 5 | $In_{0.3}Ga_{0.7}As$ | 1.0 | 5.775 |
| Fifth semiconductor 6 | $In_{0.6}Ga_{0.4}As$ | 0.7 | 5.896 |

From Table 1, it is apparent that, in the multifunction solar cell 1a obtained by the first aspect of the production method of the present embodiment, the semiconductors 2a, 3, 4, 5, and 6 are disposed such that a semiconductor located farther from the substrate 2 has a narrower band gap, for example, the second semiconductor 3 having a narrower band gap than the first semiconductor 2a, and the third semiconductor 4 having a narrower band gap than the second semiconductor 3.

Further, in the multifunction solar cell 1a, the difference of the lattice constant is 3.8% between the first semiconductor 2a and the second semiconductors 3, 0.0% between the second semiconductor 3 and the third semiconductor 4, 2.2% between the third semiconductor 4 and the fourth semiconductor 5, and 2.1% between the fourth semiconductor 5 and the fifth semiconductor 6. Thus, it is apparent that the lattice matching is not achieved, except between the second semiconductor 3 and the third semiconductor 4.

In this case, since the first semiconductor 2a is comprising GaP which is the same material as the substrate 2, it is possible to suppress the occurrence of defects at the heterojunction interface part between the substrate 2 and the wire-shaped semiconductor 2a by growing the first semiconductor 2a in the shape of a wire and then successively growing the second semiconductor 3 through the sixth semiconductor 6 in the shape of a wire.

Next, the presence or absence of defects in the respective junction interfaces of the semiconductors 2a, 3, 4, 5, and 6, which are the heterojunction interfaces, was observed with a high-resolution transmission electron microscope (HRTEM).

According to the observation by the high-resolution transmission electron microscopy, most of the semiconductors 2a, 3, 4, 5, and 6 grown in the shape of a wire had a diameter of about 20 nm. However, the largest diameter was about 50 nm. Factors such as variation in pattern drawing, variation in amorphous $SiO_2$ etching, and growth of a wire in the transverse direction probably caused the increase in the diameter of the semiconductors 2a, 3, 4, 5, and 6 grown in the shape of a wire. Further, in the semiconductors 2a, 3, 4, 5, and 6 grown in the shape of a wire, no defect was observed in the junction interfaces of the semiconductors irrespective of the diameter thereof.

Therefore, the multijunction solar cell 1a as a four-junction solar cell can achieve high efficiency because the careers generated by incident light do not recombine at the heterojunction interfaces.

Note that, in the multijunction solar cell 1a, there has been described a case where a semiconductor comprising GaP111B is used as the substrate 2, but other semiconductors may be used. Further, the substrate 2 is not limited to a semiconductor, but may comprise any material as long as it can be generally used for producing a solar cell.

Furthermore, in the multijunction solar cell 1a, the first semiconductors 2a comprising GaP are grown in the shape of a wire on the substrate 2 comprising GaP111B. However, a first single-junction solar cell comprising semiconductors 3 may be directly formed on the substrate 2 like a multijunction solar cell 1b shown in FIG. 4.

The multijunction solar cell 1b comprises a substrate 2, a semiconductor 3 grown in the shape of a wire on the substrate 2, a semiconductor 4 which is connected to an end located farther from the substrate 2 of the semiconductor 3 and is grown in the shape of a wire, a semiconductor 5 which is connected to an end located farther from the substrate 2 of the semiconductor 4 and is grown in the shape of a wire, and a semiconductor 6 which is connected to an end located farther from the substrate 2 of the semiconductor 5 and is grown in the shape of a wire. In the multijunction solar cell 1b, the semiconductor 3 forms a first single-junction solar cell; the semiconductor 4 forms a second single-junction solar cell; the semiconductor 5 forms a third single-junction solar cell; and the semiconductor 6 forms a fourth single-junction solar cell. Thus, the multijunction solar cell 1b forms a four-junction solar cell. An insulating film 8 comprising amorphous $SiO_2$ is formed in the region except the semiconductors 3 on the substrate 2, and the semiconductors 3 are insulated from each other by the insulating film 8.

In the multijunction solar cell 1b, for example, a semiconductor comprising GaP can be used as the substrate 2; a semiconductor comprising $Al_{0.3}Ga_{0.7}As$ can be used as the semiconductor 3; a semiconductor comprising GaAs can be used as the semiconductor 4; a semiconductor comprising $In_{0.3}Ga_{0.7}As$ can be used as the semiconductor 5; and a semiconductor comprising $In_{0.6}Ga_{0.4}As$ can be used as the semiconductor 6. The semiconductors 3, 4, 5, and 6 each have a length of, for example, 1 μm.

Figure 4:
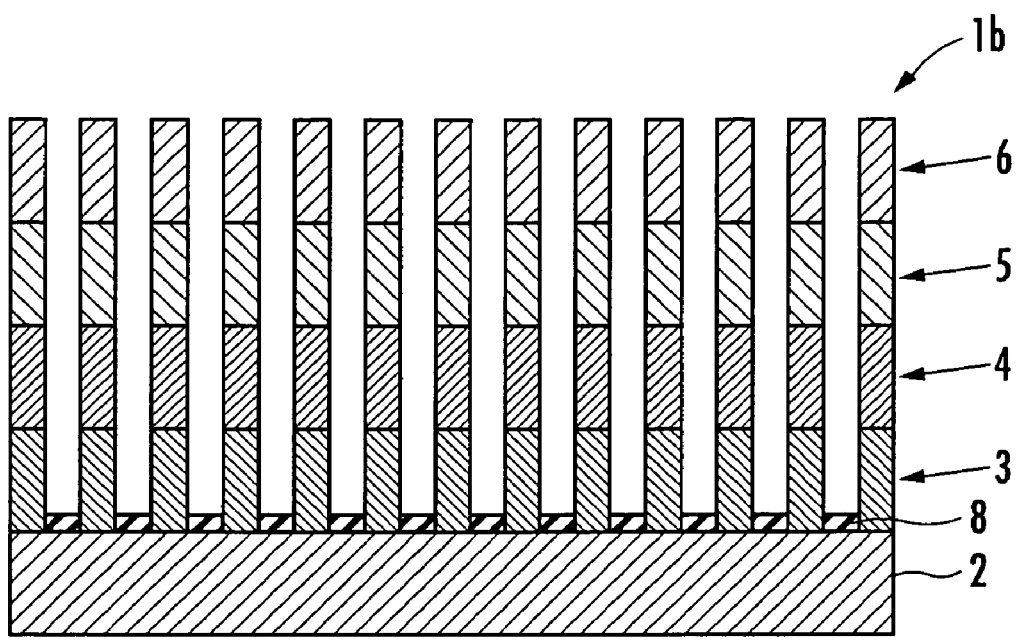
FIG. 4 is an explanatory sectional view showing the constitution of another embodiment of the multifunction solar cell obtained by the production method of the present invention.
Figure 5:
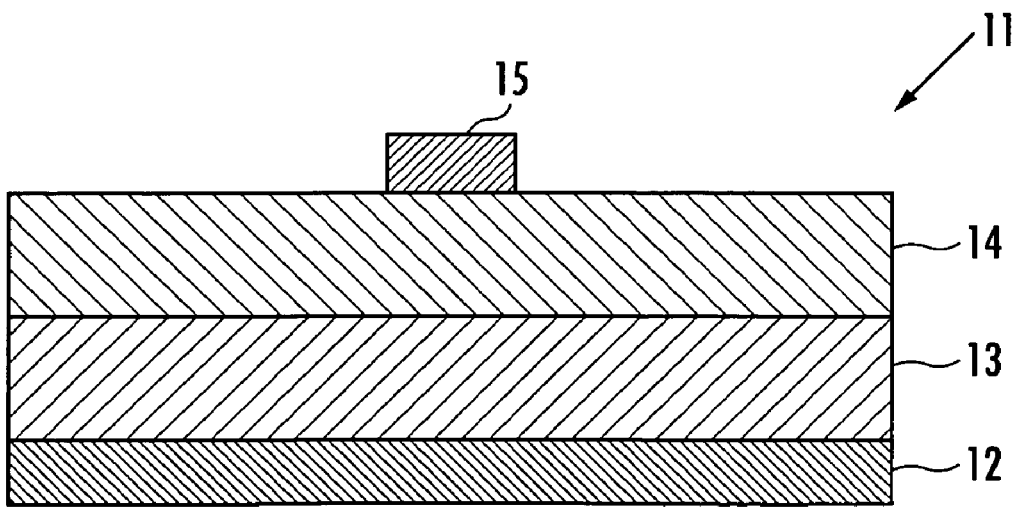
FIG. 5 is an explanatory sectional view showing a constitutional example of conventional multifunction solar cells.

Like in the case of the multijunction solar cell 1a, the multijunction solar cell 1b shown in FIG. 4 can be produced, for example, by forming the amorphous $SiO_2$ coating 8a on the surface of the substrate 2 comprising GaP, etching the coating to form nucleation sites on the substrate 2, and then mounting the substrate 2 on which the nucleation sites are formed in the reaction chamber of an MOVPE apparatus to successively grow semiconductors 3 to 6 on the substrate 2. At this time, an insulating film 8 comprising the amorphous $SiO_2$ coating 8a is formed in the region except the semiconductors 3 grown on the substrate 2 by allowing the amorphous $SiO_2$ coating 8a to remain thereon, thereby capable of insulating the semiconductors 3 to each other.

In the multifunction solar cell 1b shown in FIG. 4, since the semiconductor 2a comprising the same material as the substrate 2 is not interposed between the substrate 2 and the semiconductor 3, there is apprehension that dislocation may occur in the semiconductor 3. However, in this case, it is possible to prevent dislocation from occurring in the semiconductor 3 by reducing the diameter of the wire-shaped semiconductor 3, for example, to about 20 nm.

What is claimed is:

1. A method for producing a multijunction solar cell comprising the steps of:
    forming a nucleation site on a substrate;
    supplying a first raw material gas and growing a first semiconductor in the shape of a wire on the nucleation site, the first semiconductor comprising the same material as the substrate; and
    supplying a second raw material gas and growing a first single-junction solar cell in the shape of a wire on the first semiconductor, the single-junction solar cell comprising a second semiconductor having a narrower band gap than the first semiconductor.

2. The method for producing a multijunction solar cell according to claim 1, further comprising the steps of:
    supplying a third raw material gas and growing a second single-junction solar cell in the shape of a wire on the first single-junction solar cell, the second single-junction solar cell comprising a third semiconductor having a narrower band gap than the second semiconductor;
    supplying a fourth raw material gas and growing a third single-junction solar cell in the shape of a wire on the second single-junction solar cell, the third single-junction solar cell comprising a fourth semiconductor having a narrower band gap than the third semiconductor; and
    supplying a fifth raw material gas and growing a fourth single-junction solar cell in the shape of a wire on the third single-junction solar cell, the fourth single-junction solar cell comprising a fifth semiconductor having a narrower band gap than the fourth semiconductor.

3. The method for producing a multijunction solar cell according to claim 2, wherein the first semiconductor is GaP; the second semiconductor is $Al_{0.3}Ga_{0.7}As$; the third semiconductor is GaAs; the fourth semiconductor is $In_{0.3}Ga_{0.7}As$; and the fifth semiconductor is $In_{0.6}Ga_{0.4}As$.

4. The method for producing a multijunction solar cell according to claim 1, wherein a coating comprising an insulating material is formed on the substrate, and a part of the coating is etched to form the nucleation site.

5. The method for producing a multijunction solar cell according to claim 4, wherein an insulating film is formed in the region except the nucleation site on the substrate by allowing the coating to remain therein.

6. The method for producing a multijunction solar cell according to claim 5, wherein the insulating material comprises amorphous $SiO_2$.

7. A method for producing a multijunction solar cell comprising the steps of:
    forming a nucleation site on a substrate;

supplying a first raw material gas and growing a first single-junction solar cell in the shape of a wire on the nucleation site, the first single-junction solar cell comprising a first semiconductor; and supplying a second raw material gas and growing a second single-junction solar cell in the shape of a wire on the first single-junction solar cell, the second single-junction solar cell comprising a second semiconductor having a narrower band gap than the first semiconductor.

8. The method for producing a multijunction solar cell according to claim 7, further comprising the steps of:

supplying a third raw material gas and growing a third single-junction solar cell in the shape of a wire on the second single-junction solar cell, the third single-junction solar cell comprising a third semiconductor having a narrower band gap than the second semiconductor; and supplying a fourth raw material gas and growing a fourth single-junction solar cell in the shape of a wire on the third single-junction solar cell, the fourth single-junction solar cell comprising a fourth semiconductor having a narrower band gap than the third semiconductor.

9. The method for producing a multijunction solar cell according to claim 8, wherein the first semiconductor is $Al_{0.3}Ga_{0.7}As$; the second semiconductor is GaAs; the third semiconductor is $In_{0.3}Ga_{0.7}As$; and the fourth semiconductor is $In_{0.6}Ga_{0.4}As$.

10. The method for producing a multijunction solar cell according to claim 7, wherein a coating comprising an insulating material is formed on the substrate, and a part of the coating is etched to form the nucleation site.

11. The method for producing a multijunction solar cell according to claim 10, wherein an insulating film is formed in the region except the nucleation site on the substrate by allowing the coating to remain therein.

12. The method for producing a multijunction solar cell according to claim 11, wherein the insulating material comprises amorphous $SiO_2$.

* * * * *